United States Patent
Miley

(10) Patent No.: US 8,227,020 B1
(45) Date of Patent: Jul. 24, 2012

(54) DISLOCATION SITE FORMATION TECHNIQUES

(75) Inventor: George H. Miley, Champaign, IL (US)

(73) Assignee: NPL Associates, Inc., Champaign, IL (US)

( * ) Notice: Subject to any disclaimer, the term of this patent is extended or adjusted under 35 U.S.C. 154(b) by 1057 days.

(21) Appl. No.: 12/080,011

(22) Filed: Mar. 31, 2008

Related U.S. Application Data

(60) Provisional application No. 60/920,659, filed on Mar. 29, 2007.

(51) Int. Cl.
*B05D 5/12* (2006.01)
*H01L 39/24* (2006.01)

(52) U.S. Cl. ....... 427/62; 427/97.1; 427/419.3; 505/320
(58) Field of Classification Search ............ 427/62, 427/97.1, 419.3; 505/320
See application file for complete search history.

(56) References Cited

U.S. PATENT DOCUMENTS

| | | |
|---|---|---|
| 4,902,572 A | 2/1990 | Horne et al. |
| 4,959,242 A | 9/1990 | Itoh |
| H872 H | 1/1991 | Hendricks |
| 5,313,067 A | 5/1994 | Houk et al. |
| 5,487,078 A | 1/1996 | Rhodes et al. |
| 6,599,404 B1 | 7/2003 | Miley |
| 6,831,362 B2 | 12/2004 | Ha et al. |
| 6,921,469 B2 | 7/2005 | Larsen |
| 6,972,247 B2 * | 12/2005 | Bedell et al. ............. 438/517 |
| 7,244,887 B2 | 7/2007 | Miley |
| 2001/0019594 A1 | 9/2001 | Swartz |
| 2003/0144151 A1 | 7/2003 | Tripodi |
| 2007/0059452 A1 | 3/2007 | Debe et al. |
| 2008/0070397 A1 * | 3/2008 | Lochtefeld et al. ........... 438/597 |

OTHER PUBLICATIONS

Lipson, A, et al.; Transport and Magnetic Anomalies Below 70 K in a Hydrogen-Cycled Pd Foil with a Thermally Grown Oxide; Physical Review B 72, 212507 (2005); The Amer. Physical Society.

Nagel, D.J., et al.; Energetics of Defects and Strains in Palladium; Tenth International Conference on Cold Fusion, 2003; Cambridge, MA.

Kim, Y.E., et al.; Proposal for New Experimental Tests of the Bose-Einstein Condensation Mechanism for Low Energy Nuclear Reaction and Transmutation Processes in Deuterium Loaded Micro- and Nano-Scale Cavities; 11th Internat'l Conf. on Condensed Matter Nuclear Science, 2004, Marseille, France.

Kim, Y.E., et al., Mixtures of Charged Bosons Confined in Harmonic Traps and Bose-Einstein Condensation Mechanism for Low Energy Nuclear Reactions and Transmutation Processes in Condensed Matter; 11th International Conf. on Condensed Matter Nuclear Science, 2004, Marseilles, France.

Kim, Y.E., et al., Alternative Interpretation of Low-Energy Nuclear Reaction Processes with Deuterated Metals Based on the Bose-Einstein Condensation Mechanism; 11th International Conference on Condensed Matter Nuclear Science, 2004, Marseilles, France.

Kresge, C.T., et al.; Ordered Mesoporous Molecular Sieves Synthesized by a Liquid-Crystal Template Mechanism; Nature, Oct. 22, 1992; vol. 359; Nature Publishing Group.

(Continued)

*Primary Examiner* — Brian K Talbot
(74) *Attorney, Agent, or Firm* — Krieg DeVault LLP

(57) ABSTRACT

Techniques to form dislocation cores along an interface of a multilayer thin film structure are described. The loading and/or deloading of isotopes of hydrogen are also described in association with core formation. The described techniques can provide be applied to superconductive structure formation, x-ray and charged particle generation, nuclear reaction processes, and/or inertial confinement fusion targets.

21 Claims, 10 Drawing Sheets

OTHER PUBLICATIONS

Zhao, D., et al.; Synthesis of Continuous Mesoporous Silica Thin Films with Three-Dimensional Accessible Pore Structures; Chem. Commun., 1998, 2499-2500.

Miley, G.H., et al., Nuclear Transmutations in Thin-Film Nickel Coatings Undergoing Electrolysis; Journal of New Energy, 1996, 1(3): p. 5.

Miley, G.H.; et al.; Use of Combined NAA and SIMS Analysis for Impurity Level Isotope Detection; Journal of Radioanalytical and Nuclear Chemistry, vol. 263, No. 3 (2005) 691-696.

Miley, G.H., et al.; Review of Transmutation Reactions in Solids; Tenth International Conference on Cold Fusion, 2003, Cambridge, MA.

Lipson, A.G., et al.; Phenomenon of an Energetic Charged Particle Emission From Hydrogen/Deuterium Loaded Metals; Tenth International Conference on Cold Fusion, 2003; Cambridge, MA.

Ichimaru, Setsuo, et al.; Pycnonuclear Reactions in Dense Astrophysical and Fusion Plasmas; Physics of Plasmas, vol. 6, No. 7, Jul. 1999, American Institute of Physics.

Lipson, A.G., et al.; Evidence of Supersoichiometric H/D LENR Active Sites and High Temperature Superconductivity in a Hydrogen-Cycled Pd/PdO; ICCF-12, Yokohama Nov. 27-Dec. 3, 2005.

Atzeni, S., et al.; The Physics of Inertial Fusion; Beam Plasma Interaction, Hydrodynamics, Hot Dense Matter; Clarendon Press—Oxford; 2004.

Miley, G.H., et al.; Intense X-Ray Emission from Pd and Ti Cathodes in Deuterium Glow Discharge; Proceedings of SPIE, vol. 5197, Soft X-Ray Lasers and Applications V.

* cited by examiner

DISLOCATION SITE FORMATION TECHNIQUES

CROSS-REFERENCE TO RELATED APPLICATIONS

The present application claims the benefit of U.S. Provisional Patent Application No. 60/920,659; filed Mar. 29, 2007, which is hereby incorporated by reference in its entirety.

BACKGROUND

The present invention relates to dislocation site formation techniques, and more particularly, but not exclusively, relates to dislocation site formation along an interface between layers of a multilayer thin film structure.

A variety of experiments indicate desirable properties resulting from dislocation site formation in certain materials. Unfortunately, standard techniques provide a relatively low density of such sites, which hampers the ability to prepare commercially viable products. Thus, there is an ongoing need for further advancements in this area of technology.

SUMMARY

One embodiment of the present invention is a unique dislocation core formation technique. Other embodiments include unique methods, processes, apparatus, devices, and systems involving dislocation core formation to provide for clusters of one or more isotopes of hydrogen therein. Further embodiments, forms, features, aspects, benefits, and advantages of the present application shall become apparent from the description and figures provided herewith.

DESCRIPTION OF REPRESENTATIVE EMBODIMENTS

Figure 1:
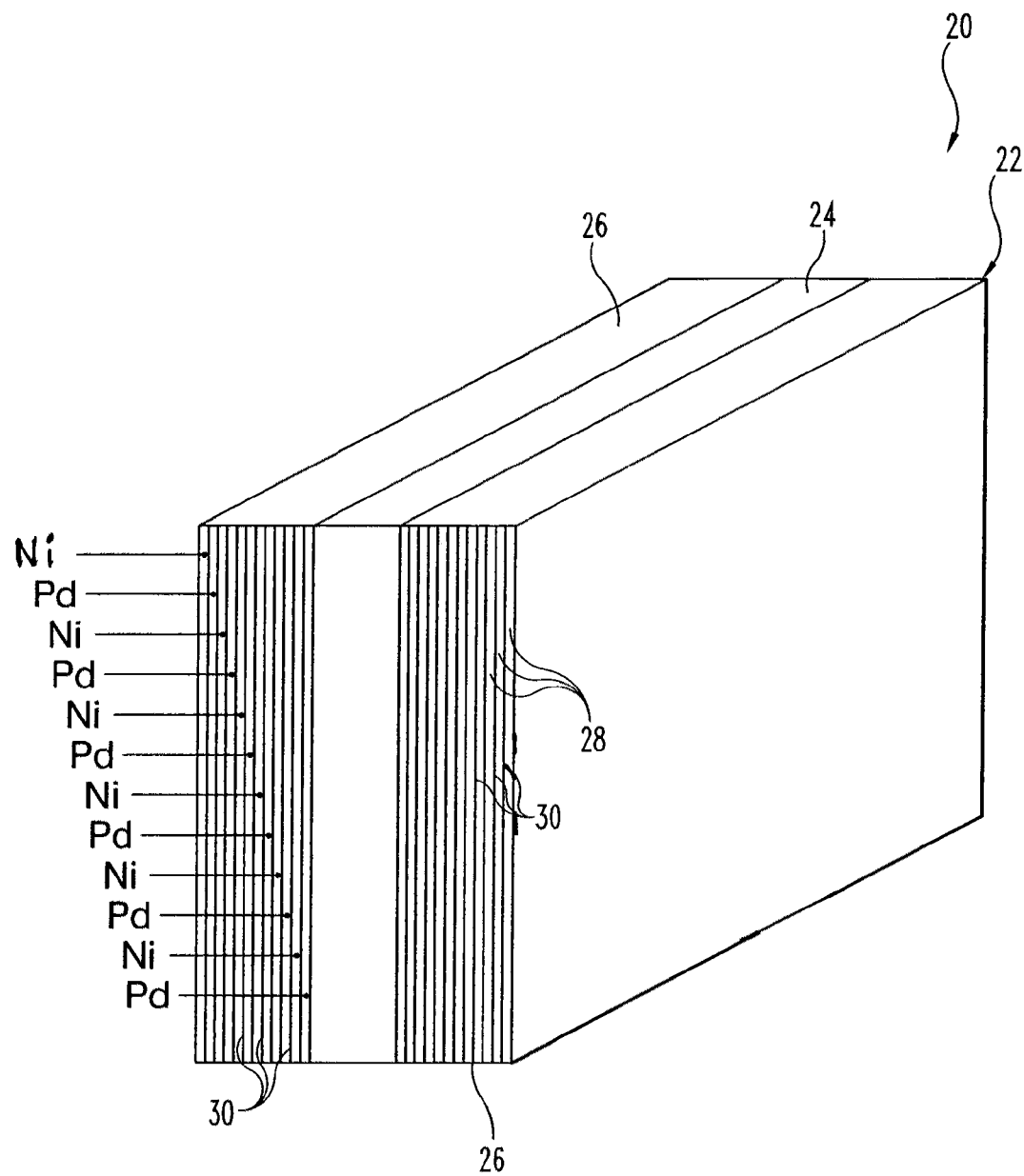
FIG. 1 is a partial schematic view of a multilayer thin film structure.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

One embodiment of the present application relates to generation of a high density of clusters of one or more isotopes of hydrogen at interfaces of multi-layer thin film structures. In one form, stress-created dislocation voids suitable for the formation of such clusters are created at the interfaces between thin films by cyclic loading and deloading of hydrogen. Alternatively or additionally, a further form employs placement of nanoscale particles or fibers between the interfaces to cause suitable void sites during manufacture of the films. Other embodiments include a configuration of the structures as electrodes, superconductors, charged particle and/or x-ray sources, and/or for use in power systems.

A further embodiment is illustrated as multilayer thin film device 20. Device 20 includes two multilayer thin film stacks 26 on opposite sides of base/substrate 24. Each stack 26 includes alternating inner layers 28 of different types of metals designated as palladium (Pd) and nickel (Ni), respectively. Between each inner layer 28 of Pd and Ni, a Pd/Ni interface 30 is formed, only a few of which are specifically designated to preserve clarity. In one form, the base 24 is fabricated from stainless steel or aluminum; however, other materials may be used in different embodiments.

In one alternative embodiment, the alternating inner layers 28 are of two dissimilar metallic materials. In a further embodiment, the alternating layers 28 are a metal and an oxide of metal, such as alternating inner layers of Pd and PdO. In another form, one layer 28 for each interface 30 is comprised of a material that readily forms a hydride and the other layer 28 for such interface 30 is comprised of material in which isotopes of hydrogen are readily accepted. By way of nonlimiting example, Pd and Ti readily form hydrides and Ni readily accepts hydrogen loading. In still another form, one of the alternating inner layers 28 includes one of the group consisting of Pd, Ti, Ni, Li, Au, Ag, U, and alloys thereof, and the other of the alternating inner layers 28 includes a different one of this group. This form is intended to include alternating layers each comprised of a different alloy of Pd, Ti, Ni, Li, Au, Ag, and/or U.

Figure 2:
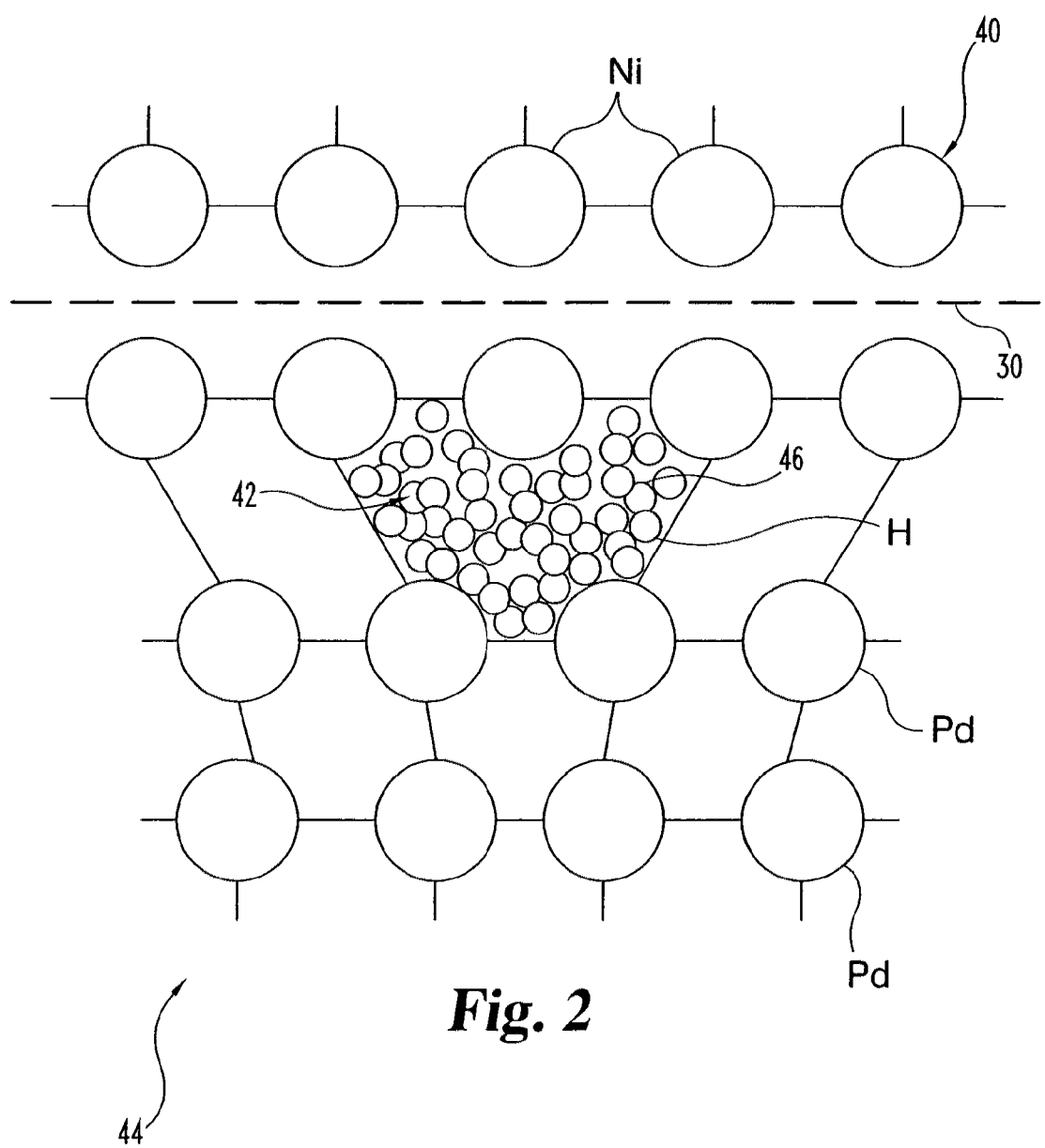
FIG. 2 is a schematic view of a dislocation core formed in a lattice of the device of FIG. 1.

Referring to FIG. 2, schematically shown is an atomic lattice 40 with a representative dislocation core 42 formed along interface 30 in a portion 44 of two internal layers 28 of device 20 (not to scale). A number of hydrogen atoms comprise cluster 46 in core 42, which may be comprised of one or more hydrogen isotopes ($^1$H, $^2$H or D(euterium), $^3$H or T(ritium)). In one form, dislocation core 42 is structured to receive a cluster 46 of at least 5 hydrogen atoms or isotopes thereof. In a more preferred form, dislocation core 42 is structured to receive a cluster 46 of at least 50 hydrogen atoms or isotopes thereof. In an even more preferred form, the dislocation core 42 is structured to receive a cluster 46 of at least 500 hydrogen atoms or isotopes thereof.

Figure 3:
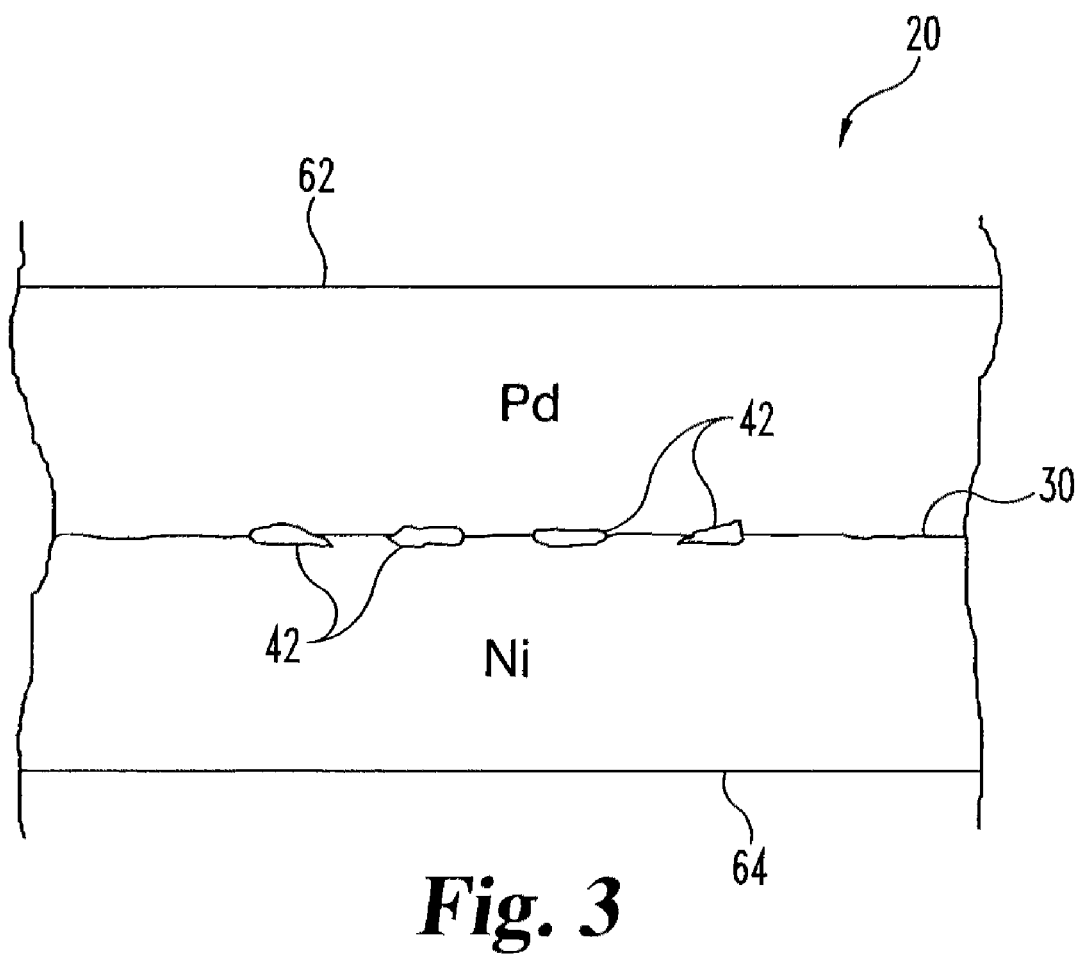
FIG. 3 is a schematic partial view of an interface between layers of the FIG. 1 device along which dislocation cores have been formed.

Referring additionally to FIG. 3, a number of dislocation cores 42 are shown schematically along interface 30 formed between inner layer 28 of Pd and inner layer 28 of Ni for device 20. In FIG. 3, the Pd layer is more specifically designated by reference numeral 62 and the Ni layer is more specifically designated by reference numeral 64. It should be understood that the nature of Pd as a more favorable hydride forming substance than Ni likely results in the formation of dislocation cores 42 in layer 62 at interface 30. The dislocation cores 42 contain mismatched atomic structures due to the different materials on each side of the interface 30—making it susceptible to stress-created dislocations, such that a large density of dislocation sites for cluster formation can be obtained with some degree of uniformity along the surface area of interface 30. The use of multiple thin film layers with many interfaces 30 approximates a nearly uniform three-dimensional volume for dislocation (and correspondingly cluster) sites to form.

In one embodiment, a technique to increase formation of dislocation cores involves preparing the thin film layer interface 30 using one or more different procedures. In one nonlimiting form, a predefined target representative of a desired dislocation site density of a multilayer thin film device design is established, and a multilayer thin film device is formed according to the design. This device formation includes providing a first layer of a first type of material and a second layer of a second type of material dissimilar from the first type of material and preparing an interface between the first layer and the second layer to increase a quantity of dislocation sites therealong in correspondence with the predefined target. After forming, the multilayer thin film device is supplied with one or more isotopes of hydrogen to form hydrogen clusters in the dislocation sites to facilitate application as a superconductor, an X-ray source, a charged particle source, as a power supply component, or the like.

Figure 4:
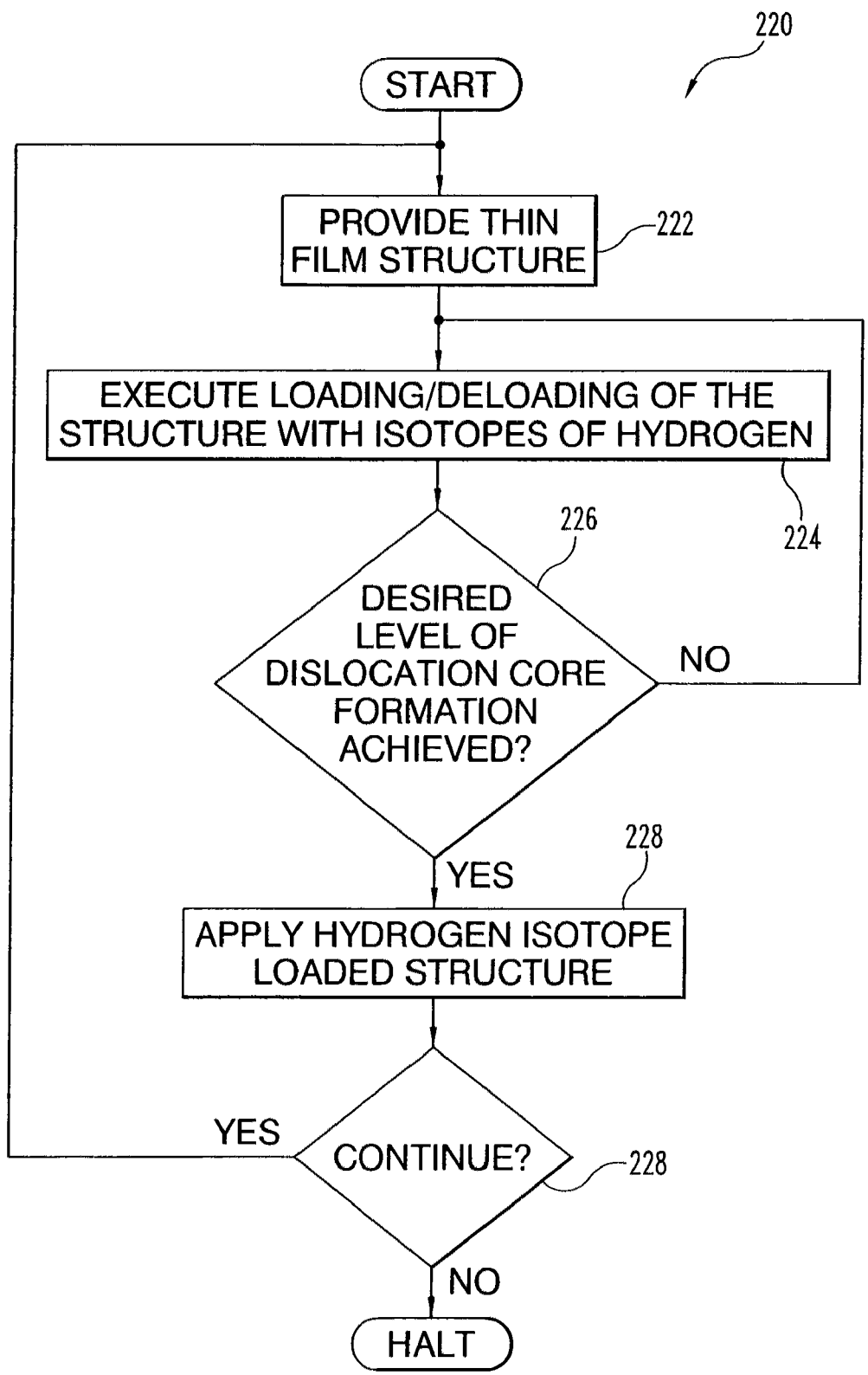
FIG. 4 is a flow chart describing one procedure for forming dislocation cores along the interface illustrated in FIG. 4.

FIG. 4 provides a flowchart of one nonlimiting procedure 220 of the present application to promote dislocation core formation. Procedure 220 begins with providing a thin film structure, such as device 20 in operation 222. Procedure 220 continues with operation 224 in which the thin film structure is loaded with one or more isotopes of hydrogen using any of several techniques. These techniques include: electrolysis hydrogen loading, pulsed plasma bombardment hydrogen loading, and gas pressure hydrogen loading. During loading, the metal lattice is expanded by the entering hydrogen atoms, creating stress which causes dislocation core formation. In one implementation, loading occurs at several atmospheres for several hours. After loading, the structure is deloaded in operation 224. Deloading of the loaded hydrogen allows repetition of the loading stresses and progressively forms added dislocation cores. In one nonlimiting form, deloading occurs for about two hours by pumping a chamber containing the structure down to hard vacuum.

From the loading/deloading of operation 224, procedure 220 continues with conditional 226. Conditional 226 tests whether a desired level of dislocation core formation has taken place. If the test outcome is false (no), then the loading/deloading cycle of operation 224 is repeated until the test is true (yes). The cycle may be repeated for several days up to a week or more, and such cycles may be timed and or with other salient parameters that are uniform/periodic from one to the next or nonuniform/aperiodic in nature. In one form, at least 5 cycles are performed. In a more preferred form, at least 10 cycles are preformed. In an even more preferred form, at least 25 cycles are preformed.

The test may be satisfied simply when a predetermined number of loading/deloading cycles of operation 224 are completed. Alternatively or additionally, the test of conditional 226 may be satisfied by direct observation and/or by indirect measurement. In one example, the test is satisfied by gas pressure measurements to determine flows in and out of the sample during loading and deloading. The process is continued until these pressure measurements indicate that a saturation amount of retained gas is achieved, i.e. the a target dislocation site/cluster level has been formed. From conditional 226, procedure 220 continues with operation 228. In operation 228, hydrogen is supplied to the structure to provide clustering in the dislocation cores formed by the repetitive loading/deloading cycles and applied as desired as a superconductor, an X-ray source, a charged particle source, as a power supply component, or the like. Depending on the application, a continuous flow of one or more hydrogen isotopes may be provided in operation 228 and/or an intermittent supply provided.

Figure 5:
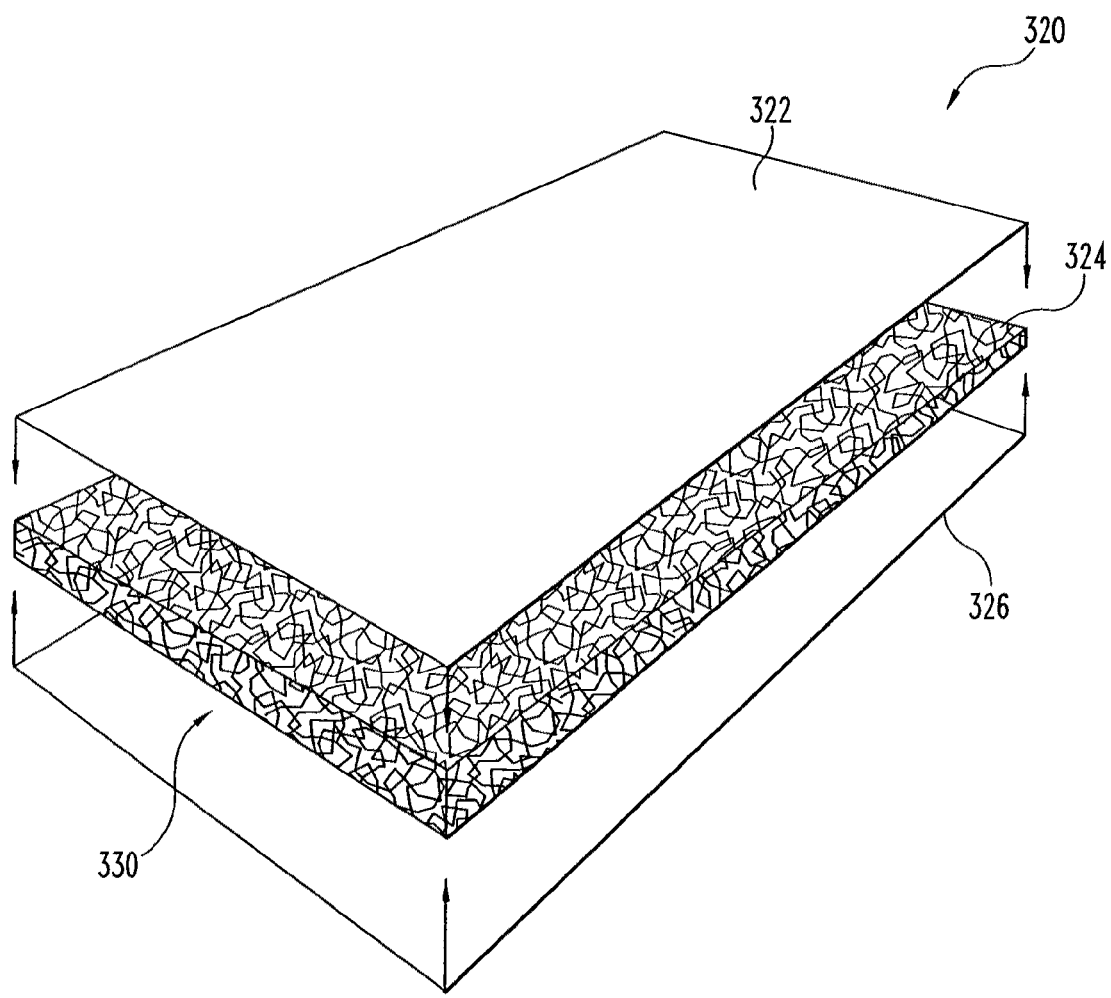
FIG. 5 is a partial schematic view of a multilayer thin film device including a void-inducing material structured to form dislocation cores along an interface between different layers.

A further procedure for forming dislocation sites at the thin film interfaces involves placing microscale and/or nanoscale material between the layers. This material is in the form of particles, wires, fibers, meshes, a porous film/layer, or a combination of these. FIG. 5 schematically illustrates thin film device 320. Device 320 includes thin film layer 322 and thin film layer 326 with a dislocation site-inducing structure 324 positioned therebetween along the resulting thin film layer interface 330. Structure 324 can be a microscale and/or nanoscale material that causes voids and discontinuities to form along the interface in the nanoscale range. It should be appreciated that microscale materials frequently are structured to form nanoscale voids between its constituents and/or with one or more of layers 324 and 326, from which dislocation cores result. Specifically, the thickness of the structure involved is desirably selected to obtain the dislocation site density. Generally, dislocation sites form around the intersections of the microscale/nanoscale structures where a void occurs between layers. Note that with preformed nanoscale voids in the structure 324, loading without cycling can achieve a higher dislocation site and corresponding hydrogen isotope cluster density.

Figure 6:
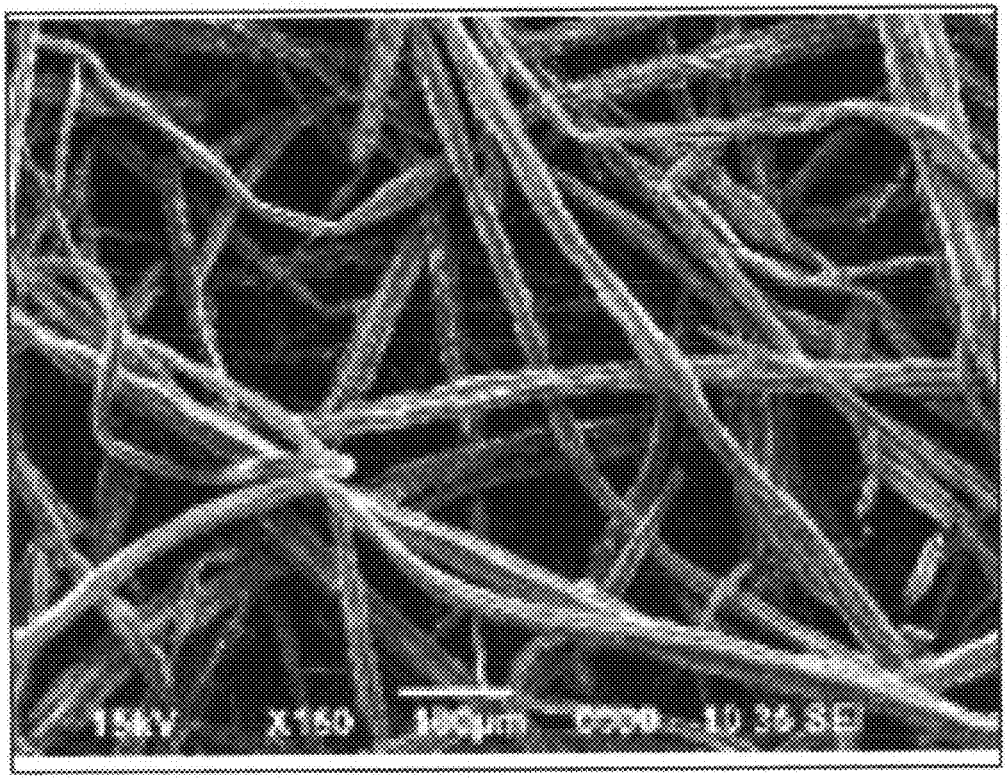
FIG. 6 is a computer-generated image of a micro-nickel mesh utilized as the void-inducing material for the device of FIG. 5.

FIG. 6 illustrates a computer-generated image of a micro-nickel fiber (MNF) mesh 424. Mesh 424 is one nonlimiting form of structure 324. Mesh 424 has dimensions in the microscale range as can be observed in the image of FIG. 7, which includes a reference distance of 100 micrometers (100 µm) in the bottom center portion. In one process that used MNF, a Pd film is sputtered onto a ceramic substrate, and the MNF is then placed on top of the Pd film. This arrangement is then heated and maintained at several hundred degrees C. in a vacuum chamber for ~2 hours for out-gassing and annealing. Next, a second thin film is sputtered onto the top of the MNF. The process is then repeated to build-up the desired layering for the multilayer device.

Figure 7:
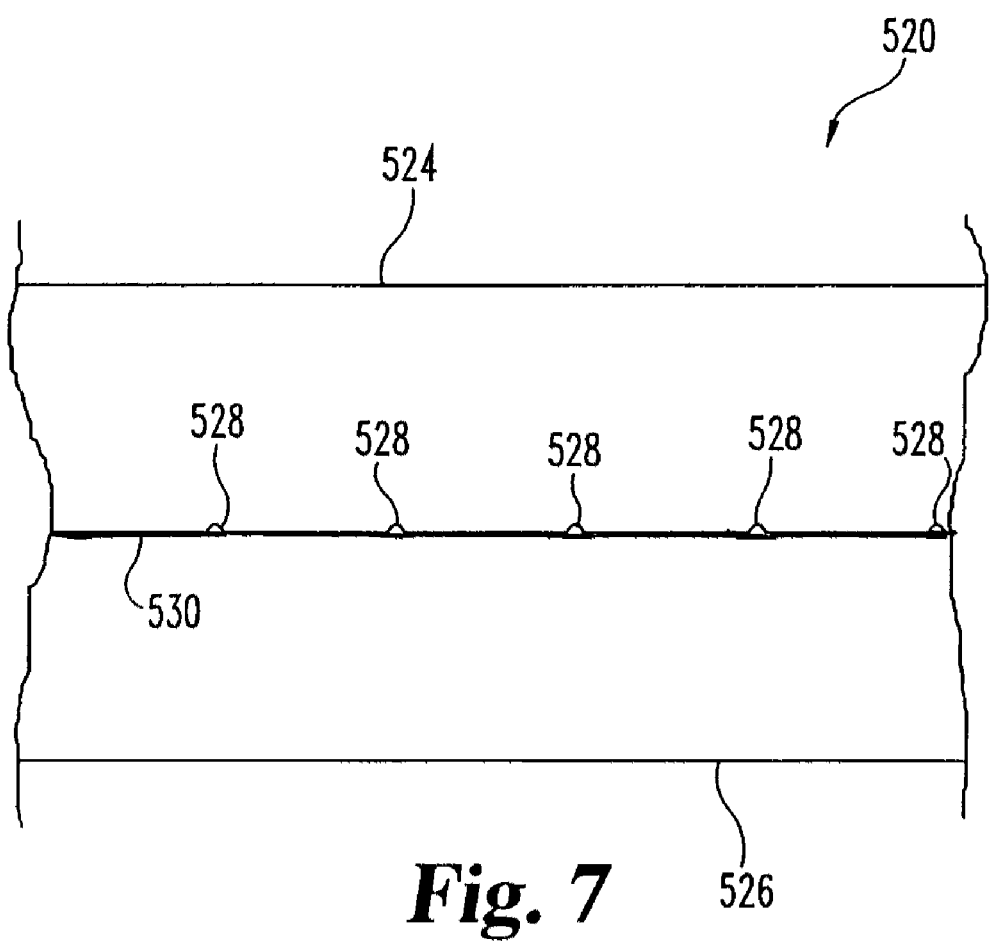
FIG. 7 is a schematic view of a multilayer thin film device including channels formed in one of the layers along the interface between the layers to form dislocation cores.

FIG. 7 illustrates multilayer thin film device 520 that incorporates another technique to provide for the formation of nanoscale voids that induce dislocation site formation. Device 520 is partially shown, including thin film layer 524 and thin film layer 526 that form interface 530 therebetween. Along interface 530, a number of microscale and/or or nanoscale channels 528 are formed in the face of layer 524 to provide for the formation of dislocation sites. In one form, micro-grooving is used to create a "scratch" pattern on the thin-film prior to deposition of the subsequent layer. While sputtering was used in these preparations, in other embodiments alternate techniques can be used, such as plasma deposition, electroplating could be used, chemical vapor deposition, and/or or physical vapor deposition could be used.

While only shown with two layers, it should be understood that device 320 or 520 can each include a greater number of alternating thin film layers to provide a number of interfaces 330 or 530 between each alternating layer pair. It should be appreciated that the alternate layer compositions described in connection with device 20 can also be utilized with device 320 and/or device 520. Likewise, it should appreciated that any of the dislocation core formation techniques (and correspondingly the cluster formation techniques) described with any embodiment of these devices can be used in combination or as alternatives to one another in other embodiments.

Figure 8:
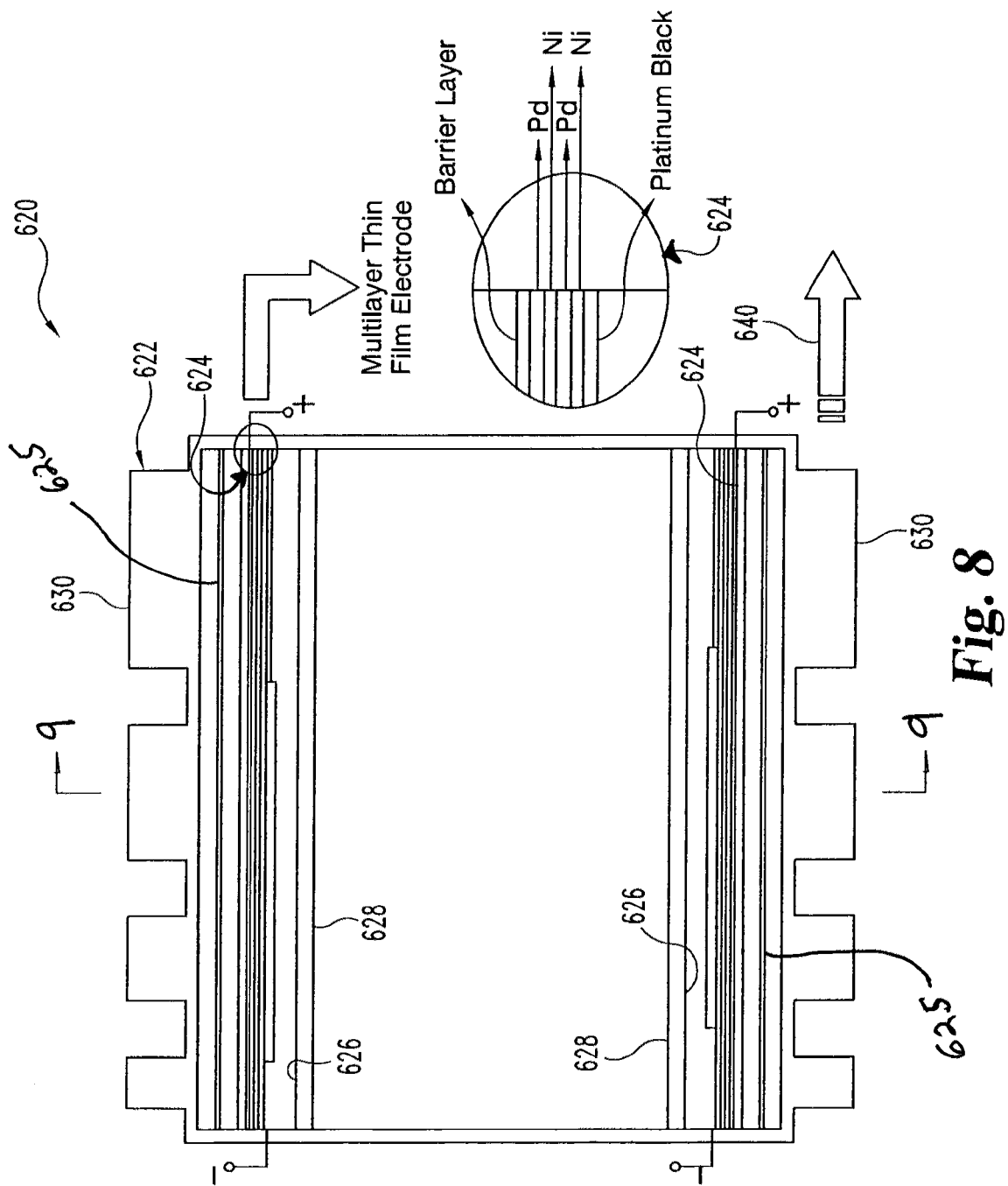
FIG. 8 is a partial schematic sectional view of a device for a power system incorporating a multilayer thin film electrode.
Figure 9:
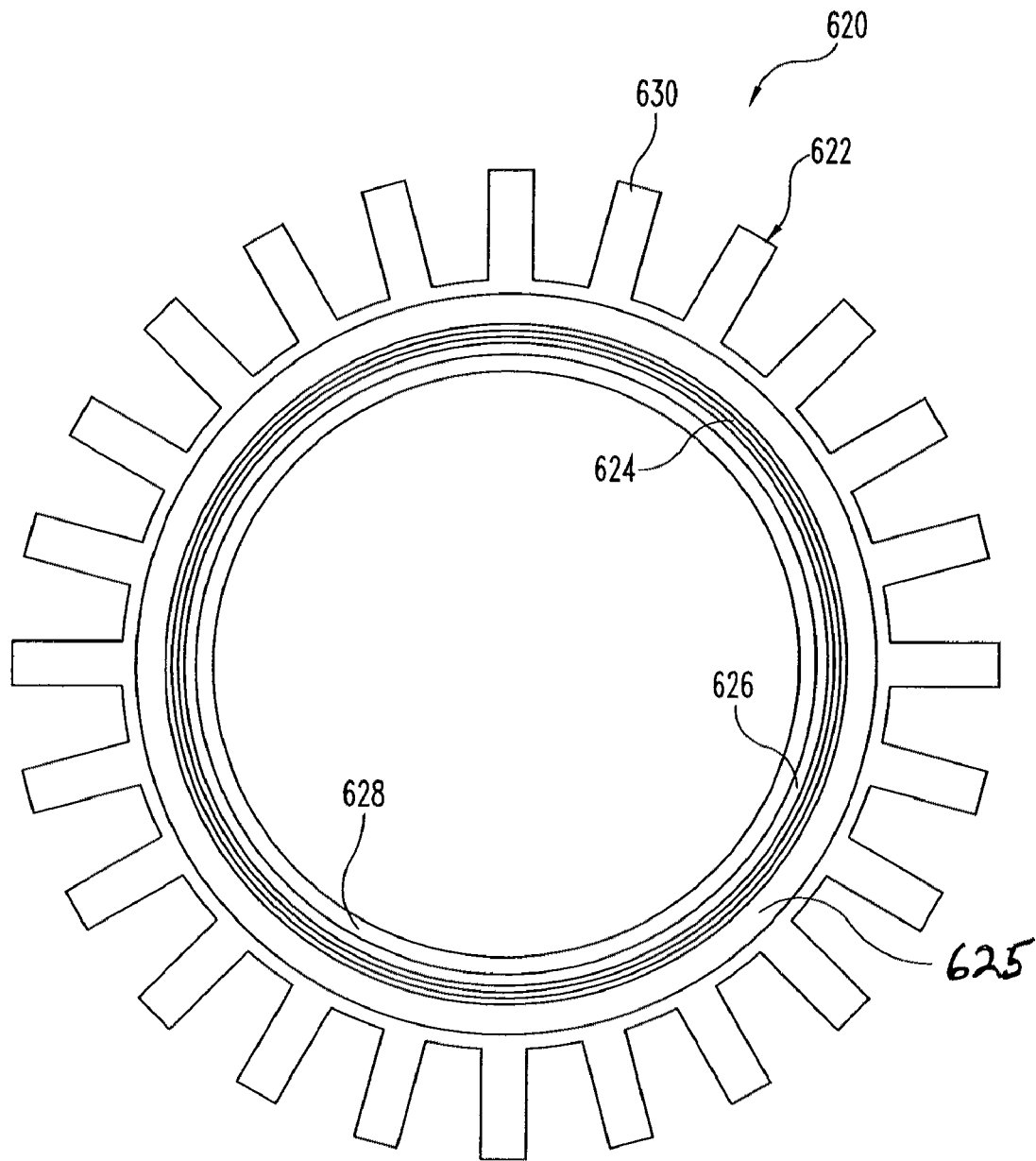
FIG. 9 is a further view of the device taken along section line 9-9 in FIG. 8.

A number of different implementations of the thin film structures of the present application are envisioned. For instance, FIGS. 8 and 9 depict a hydride-loaded, thin-film multilayer electrode power system 620. FIG. 9 is taken along section line 9-9 of FIG. 8, illustrating an approximately cylindrical profile. System 620 includes a multilayer thin film electrode structure 624 inside a cylindrical housing 622. Structure 624 includes alternating inner layers of Pt and Ni, with an outer barrier layer and inner platinum (Pt) block (see inset of FIG. 8). Inside structure 624 is a hydride donor layer 626 structured to donate protons, such as (LaNiH$_x$) for cluster formation in dislocation sites of structure 624. Inside layer 626 is a semitransparent oxide layer 628. A standard-type thermoelectric converter 625 is included outside of structure 624 to concert thermal energy from the electrode to electrical energy. Radial fins 630 provide for thermal dissipation in concert with coolant flow (such as ambient air) represented by arrow 640. U.S. Pat. No. 7,244,887 (issued Jul. 17, 2007) provides additional background information regarding this type of power system arrangement, and is hereby incorporated by reference.

The Pt and Ni films of structure 624 are prepared on a cylindrically shaped Pt substrate block using one or more of the techniques to prepare enhanced dislocation site density and corresponding cluster formation, as described in connection with FIGS. 1-7. Structure 624 could use different thin film compositions, layer quantities, and the like of any of the embodiments previously described in connection with FIGS. 1-7.

Another application of any of these embodiments is to provide superconducting structures. Such structures could be in the form of thin plates or in the form of wires. In one nonlimiting superconductor implementation, a thin film structure geometry is selected to form dislocation cores that provide a corresponding hydrogen cluster density with a large cross sectional area. As previously described, still other embodiments utilize the inventive aspects of the present application to prepare multilayer thin film structures for X-ray and/or charged particle sources.

Figure 10:
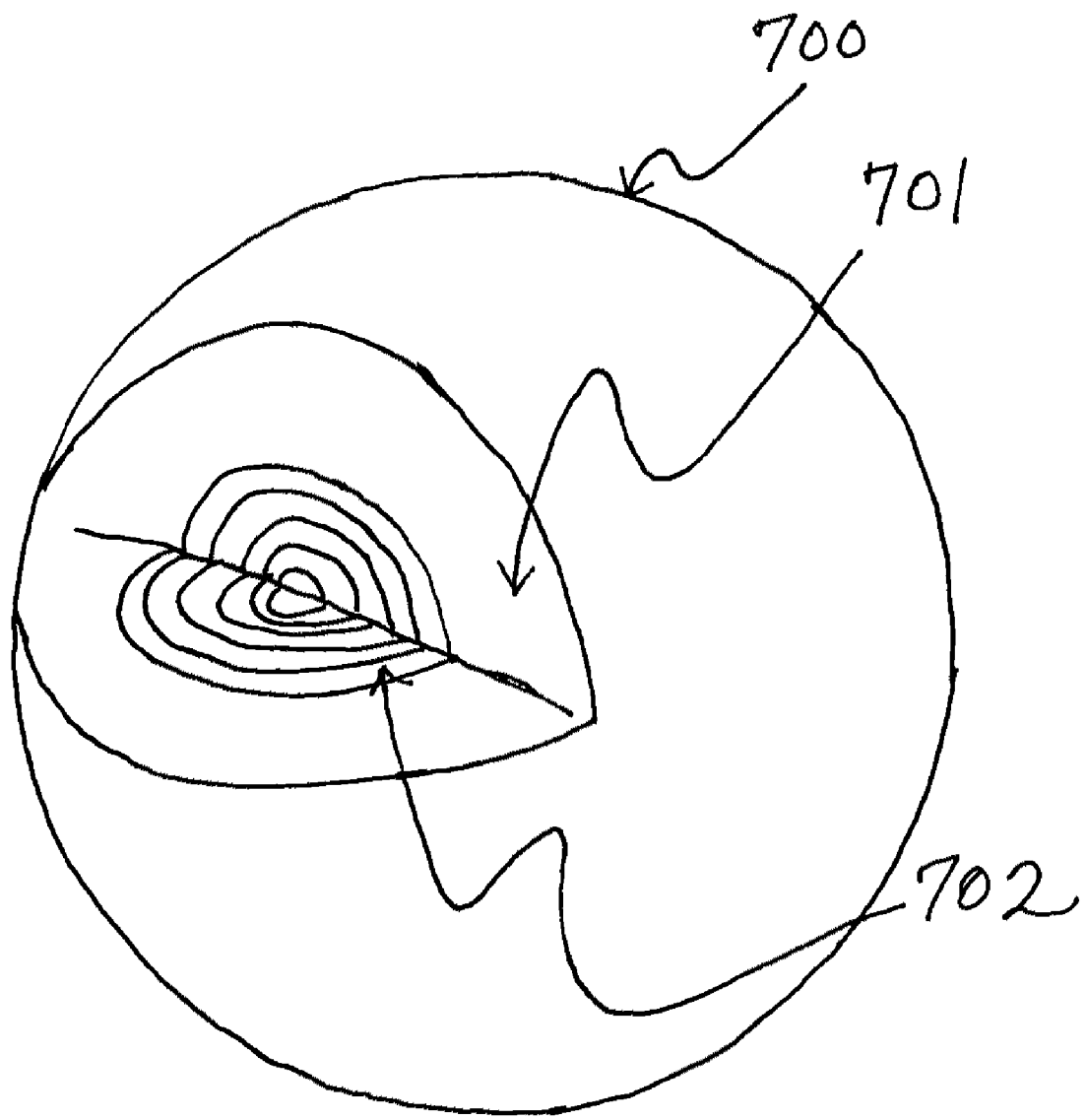
FIG. 10 is partial schematic view of a multilayer thin film device structured as an inertial confinement fusion target.

FIG. 10 depicts inertial confinement fusion target 700 of yet a further embodiment of the present application in a partial schematic, cutaway form. In one nonlimiting form, target 700 is an approximately spherical, ultra-high density inertial confinement fusion fuel (ICF) target and is provided in the micron to millimeter size range. A conventional ablator-tamper 701 (such as described in S. Atzeni and T. Meyer-TerVehn, *The Physics of Inertial Fusion*, Oxford University Press, 2004, which is hereby incorporated by reference), surrounds a multi-layer device 702. Device 702 includes alternating layers of different materials with interfaces suitably forming a region of dislocation cores prepared according to one or more of the previously described embodiments of the present application. The dislocation cores of this region are loaded with hydrogen isotopes such as deuterium and/or tritium. When exposed to a pulsed laser beam or ion beam of sufficient intensity (such as available at the ICF facility at the Lawrence Livermore National Laboratory (USA)), ablation of the ablation-tamper 701 material results in compression of the core region 702—such compression may be by a factor of 100 to 1000 in terms of volume. Because the hydrogen isotope clusters in dislocation sites start at densities typically well above that of gaseous or cryogenic deuterium-tritium generally employed, the compressed density of the isotopes in the clusters will be correspondingly higher, which in turn can result in higher fusion rates (proportioned to the square of the isotope density) and an increased burn-up fraction (fraction of the original isotope burned in the imploded target). This improved performance is of interest for fusion power studies and applications thereof (such as power systems), particle/radiation generation, and the like. Additionally or alternatively, target 700 can be adapted to other types of targets currently employed in ICF studies such as indirect-drive holrahm targets as further described by Atzeni and Meyer-TerVehn in *The Physics of Inertial Fusion*, Oxford University Press, 2004, (previously incorporated by reference).

EXPERIMENTAL OBSERVATIONS

The following experimental observations are intended to enhance clarity and understanding of the inventive aspects of the present application and are not meant to be restrictive in character.

Studies have been performed in which hydrogen isotopes ($^1$H, deuterium (D or $^2$H), and/or tritium (T or $^3$H)) have been loaded into thin-film electrodes comprised of selected metals such as palladium (Pd), titanium (Ti), and nickel (Ni). These studies indicate creation of dislocation cores in the metallic lattice that are capable fostering hydrogen cluster formation. Evidence of such formation includes: localized low energy nuclear reaction products observed in electrodes after thin film electrolysis, localized energetic charged particle tracks in CR-39 detectors located on surface of electrodes during thin-film electrolysis, X-ray "beamlet" formation from localized sites during pulsed plasma bombardment of thin film electrode targets, and measurement of near-superconductivity in dislocation sites. These sites are believed to host reaction clusters of hydrogen.

More specifically, a variety of thin film electrode electrolysis experiments demonstrate local reaction sites. Early studies used a multilayer thin-film electrode with alternating layers of materials such as Pd and Ni that have a Fermi energy level difference such as to cause a high electron density (term the "swimming electron layer") at the interface between thin films. Later studies used either thin films coated on micro-sized plastic beads or a unique thin-film cathode-anode combination coated onto a substrate (typically a silica or ceramic sheet). In this configuration, the electric field during electrolysis is parallel to the substrate, hence along the surface direction of the thin films. It is observed from broad area SIMNs analysis of these electrodes that the reaction products tend to occur in localized areas distributed across the electrode. In addition, localized areas of heating have been observed. Both the localization of products and the hot spot damage areas are indicative that reactions take place at micro-sized sites.

CR-39 is a well known method for detection of energetic charged particles. Cr-39 is a plastic which is damaged by passage of a charged particle. Subsequent etching in a NaOH solution exposes a visible track. Measurement of the diameter and length of the track using a microscope then gives definitive data about the particle involved. CR-39 detectors were placed next to thin film electrodes during electrolysis. CR-39 detectors (manufactured by "Landauer Co.") rad-track chips; S=2.0×1.0 cm$^2$ were attached to Pd/Ni thin film cathode; to the substrate side and/or immersed in electrolyte in the cell near the electrode. The detectors were annealed to have a low initial Background before electrolysis: N(Bg)<40 track/cm$^2$. Some of the CR-39 was covered with a 25 μm Cu-film to identify the type of emitted particle by its ability to penetrate this film. Several tracks from the CR-39 film after etching were observed. Analysis of the track sizes correspond to 1.7 MeV protons and 14.7 MeV alpha particles.

Various plasma discharge experiments were performed in which a deuterium gas based discharge bombards a thin-film Palladium target (cathode) in a pulsed discharge. Anomalous soft x-ray emission from the target is observed which is attributed to formation of an ion cluster type formation in the target during the pulsed loading. An experimental Glow Discharge (GD) setup was used for these studies. A positive voltage is applied at the anode. The cathode and vessel were grounded. Plasma is produced between this and the water-cooled cathode. The cathode is mounted on a movable mount to vary electrode spacing while the GD plasma region is surrounded by a glass cylinder to prevent arcing. An AXUV photodiode detector used for x-ray detection employed a thin Be filter to block visible light from the detector. This filter cuts off x-rays<600-eV. A typical result from this detector indicates peak X-ray emission at p=500 mTorr V=250V I=2 A for a thin film Pd cathode. The delay time on the order of ~msec before onset of x-rays is associated with D diffusion time into the target starting at the beginning of the pulsed discharge. Due to the filter X-rays are >600 eV while the discharge voltage is 250 V, this suggests x-ray generation is due to collective effects occurring in the cluster where the x-rays originate. A reference experiment where a thin copper foil cu foil was placed in front of the Be filter causes the trailing spike (i.e. the x-rays) to disappear, which confirms that the x-ray signal is not due to extraneous noise pick-up. Further evidence that x-ray emission is from localized sites comes from related experiments by A. Karabut who placed a plastic "window" in the path of the x-ray beam and observed a damage pattern on it. In summary, these x-ray studies support the existence of reactive clusters in a metal target such as Pd using a plasma bombardment of thin electrodes. In this case, the pulsed bombardment causes a strong inward hydrogen isotope transport which can stress the metal late causing dislocation void formation which in turn provides the site for cluster formation. In this sense, pulsed plasma loading of hydrogen is an alternate technique to electrolytic loading described earlier.

The superconductivity of cluster-type states formed in dislocation sites in Pd has been studied. These experiments used a special cyclic "loading—deloading" technique to create stress induced dislocation sites fostering cluster formation. Two separate techniques were used in the study: (1) $H_2$ gas pressure loading-deloading cycles were applied to a single crystal thin film Pd electrode with the deloading taking place for 2 hours. Alternately, electrochemical cycling (cathode loading-anodic deloading) with a current of 5.0 mA/cm² in $1M Li_2SO_4/H_2O$ was used with a Pd/PdO cold-worked electrode. Both electrodes were initially prepared by annealing for 2 hours at about 580 K. The electrodes were subsequently examined for ferromagnetic properties associated with superconductivity using a "Quantum Design" 1T-SQUID type instrument operating in both DC and AC modes. The results from the SQUID measurements are summarized as follows. After repeated H-cycling, both the $Pd:H_x$ and $Pd/PdO:H_x$ samples contained an ultra-high density condensed hydrogen phase inside the dislocation sites or "cores." While the average loading ratio (atoms H/Pd) of the electrodes was only $(3.8-5.5)\times 10^{-4}$ with respect to the gross sample volume, local ratios as high as ~5-1000 occurred inside the clusters formed in the small dislocation cores. The loading ratio in the cluster region depends on the core size relative to the lattice spacing. In the present case loading ratios varied over a large range due to a random distribution of core sizes. The SQUID measurements of the electrodes demonstrated a weak type II superconductivity, involving a condensed hydrogen phase in the dislocation sites (i.e. "cores") below ~30 Kelvin (K). Both magnetic and transport measurements of the electrodes indicate a superconducting transition below 70 K. A reproducible Meissner-effect was obtained in 1 kHz AC field at H≦1.0 Oe. In summary, these results show that the localized clusters are in a condensed mode giving metallic-like properties with low temperature superconductivity properties in the loaded dislocation cores corresponding to hydrogen clusters.

Pyconuclear reactions in astrophysical objects address behavior of a high density of hydrogen isotopes, and correspondingly provide a basis for considering hydrogen cluster behavior in dislocation cores. Such reactions are believed to take place even at "zero temperature" in condensed matter due to ions fluctuating about their lattice sites in coherence with the zero-point energy $E_0 \neq \hbar\omega_0$. Due to close spacing and this fluctuation, these ions may penetrate the Coulomb barrier of a neighboring ion causing nuclear reactions.

In hydrogen-loaded dislocation cores, cluster ions have a close spacing and a higher fluctuation frequency because they have a finite temperature. Pyconuclear principles can be applied with a temperature correction. Further, hydrogen-loaded cluster behavior is also enhanced by the strong diffusion (sometimes called "hopping") of the hydrogen isotope (such as H or D) during loading (or deloading). The diffusing ions flow through the cluster sites, undergoing collisions with the cluster atoms, thus transmitting momentum to them. This enhances the oscillations of the cluster atoms and can be roughly account for the added collisional energy. Calculations based on this theory, show that the higher reaction rates such as observed in the low energy reaction experiments correspond to this flow, but the low rate radiation emission experiments have a much lower flow correction while superconducting structures do not involve flow.

Reaction rate calculations without flow based on conventional Pyconuclear reaction theory are presented as follows along with calculations where the flow is included through use of an effective temperature:

Now turn to reactions in a crystal lattice. The reaction rate per ion pair is $$W = (inc.\ \text{flux}) \times T \times 4\pi R_n^2 P_n$$
$$= \upsilon |\psi_{inc}|^2 \frac{TS(E)}{E},$$

where we have to calculate $|\psi_{inc}|^2$ and T using the lattice potential for $r > R_n$. The measured nuclear factor S(E) remains the same as before.

$$P_o = \left(\frac{\rho}{A}\right) A^2 Z^4 S \gamma \lambda^{7/4} \exp(-\varepsilon\lambda^{-1/2}) s^{-1} \text{cm}^{-3},$$

with $\gamma = 3.90 \times 10^{46}, \varepsilon = 2.638,$

Results using these equations confirm that the reaction rate strongly depends on dislocation core loading and on flow rate. For example, in the cyclic loading-deloading a low rate of charge particle emission was seen from CR-39. Much higher reaction rates were obtained in thin film reactions. The cluster loading (atoms of D/atoms Pd) along with the flow rate were varied in the following calculations to match the experimentally observed reaction rates (rx/cm3-sec): (a) for low rates of ~1 reaction/cm³-sec, as in the Cr-39 tracks during unloading (flow), a loading of ~8 D/Pd matches without flow and for flow matching of the deloading value, only ~2 D/Pd are required; and (b) for high reaction rates, e.g. $10^{14}$ reactions/cc-s, a loading of ~12 D/Pd matches with an estimated flow 5× the deloading value used above. Consequently, developments in pyconuclear astrophysics are consistent with hydrogen cluster behavior in dislocation sites. Because of its nonlinearity, it is expected that reaction rate increases rapidly with higher hydrogen isotope loading and flow rate. Further, with little or no flow rate, a viable superconducting state results in correspondence to the degree of loading.

Many further embodiments of the present application are envisioned. For example, one further embodiment comprises: establishing a predefined target representative of a desired dislocation core density of a multilayer thin film device design; forming a multilayer thin film device according to the design; and after forming it, loading the multilayer thin film device with an amount of one or more isotopes of hydrogen to form hydrogen clusters in the dislocation cores. In one form, the formation of the multilayer thin film device includes providing a first layer of a first type of metal and a second layer of a second type of metal dissimilar from the first type of metal, and preparing an interface between the first layer and the second layer to increase a quantity of the dislocation cores therealong and in correspondence with the predefined target.

Another example includes preparing a multilayer thin film device including a first layer of a first type of metal and a second layer of a second type of metal dissimilar from the first type of metal; repetitively loading it and deloading the device with one or more isotopes of hydrogen at least ten times during the preparing thereof; and supplying a flow of at least one isotope of hydrogen to operate the device.

Still another example comprises: a multilayer thin film device including a first layer of a first type of metal and a second layer of a second type of metal dissimilar from the first type of metal, means for repetitively loading and deloading the device with one or more isotopes of hydrogen during the preparation thereof, and means for supplying a flow of at least one isotope of hydrogen to the device.

Yet another embodiment comprises: preparing a multilayer thin film device including a first layer of a first type of metal and a second layer of a second type of metal dissimilar from the first type of metal; providing nanoscale voids along an interface between the first layer and the second layer during the preparing of the multilayer thin film device, which includes at least one of (a) placing nanoscale material along the interface and (b) forming one or more of a plurality of channels, pores, holes, or voids in one or more of the first layer and the second layer, and supplying one or more isotopes of hydrogen to the device to form hydrogen clusters therein.

A further example includes: a source of one or more isotopes of hydrogen, a multilayer thin film device in communication with the source to receive the one or more isotopes of hydrogen therefrom, the multilayer thin film device including a first layer and a second layer of a different material than the first layer, the first layer being of a metallic type effective to form a hydride with the one or more isotopes of hydrogen, an interface between the first layer and the second layer and a material positioned along the interface to form a plurality of nanoscale voids to increase a quantity of dislocation cores formed along the interface and correspondingly increases loading of the one or more isotopes of hydrogen from the source. In one form, the material includes one or more of micro-scale particles, fibers, wires, and mesh. Alternatively or additionally, the material includes a porous metallic substance.

Still a further embodiment comprises a multilayer thin film device including a first layer with means for forming a hydride with one or more isotopes of hydrogen and a second layer of a material different than the first layer; means for increasing dislocation core formation along an interface between the first layer and the second layer; and means for supplying the multilayer thin film device with at least one isotope of hydrogen.

As used herein, "nanoscale" refers to a dimension of 100 nanometers or less, and microscale refers to a dimension of 100 micrometers or less. Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow. In reading the claims it is intended that when words such as "a," "an," "at least one," "at least a portion" are used there is no intention to limit the claim to only one item unless specifically stated to the contrary in the claim. Further, when the language "at least a portion" and/or "a portion" is used the item may include a portion and/or the entire item unless specifically stated to the contrary. The present application hereby incorporates by reference all publications, patents and patent applications set forth herein, including but not limited to: G. H. Miley, and J. A. Patterson, "Nuclear Transmutation in Thin-film Coatings Undergoing Electrolysis," *Journal New Energy*, Vol. 1, 1993. pp. 11-15; G. H. Miley, G. Name, T. Woo, "Use of Combined NAA and SIMS Analyses for Impurity Level Isotope Detection", *Journal of Radioanalytical and Nuclear Chemistry*, Vol. 263, No. 3, (2005). pp. 691-696; G. H. Miley and P. J. Shrestha, "Review of Transmutation Reactions in Solids", *Condensed Matter Nuclear Science*, P. Hagelstein and S. Chubb, eds., World Scientific Press, New Jersey, 2006. pp 364-378; A. G. Lipson, G. H. Miley, A. S. Roussetski, and E. I. Saunin, "Phenomenon of Energetic Charged Particle Emission from the Hydrogen/Deuterium Loaded Metals", *Condensed Matter Nuclear Science*, P. Hagelstein and S. Chubb eds., World Scientific Press, New Jersey, 2006. Pp 539-575; G. H. Miley and A. G. Lipson, "Intense X-ray emission from highly loaded hydrides", *Proc. of SPIE*, vol 5197, p 35 (2004); A. Lipson, G. H. Miley, et al., "Emergence of a High-Temperature Superconductivity in Hydrogen Cycled Pd compounds suggest localized Superstochiometric H/D Sites", *Proceedings, ICCF*-12, 2005, Nagoya, Japan; Lispon, B. Heuser, C. Castano, G. Miley, B. Lyakhov, and A. Mitin "Transport and Magnetic Anomalies below 70 K in a Hydrogen-cycled Pd Foil with a Thermally Grown Oxide", *Physical Review* B 72, 212507, Dec. 13, (2005); S. Ichimaru and H Kitamura, "Pyconuclear reactions in dense astrophysical and fusion plasmas", *Phys. Plasmas*, Vol. 6, No. 7, 1999. pp 2649-2671; and TBD. While the invention has been illustrated and described in detail in the drawings and foregoing description, the same is to be considered as illustrative and not restrictive in character, it being understood that only the selected embodiments have been shown and described and that all changes, modifications and equivalents that come within the spirit of the invention as defined herein or by any of the following claims are desired to be protected.

What is claimed is:

1. A method, comprising:
   establishing a predefined target representative of a desired dislocation site density of a multilayer thin film device design;
   forming a multilayer thin film device according to the design, which includes:
      providing a first layer of a first type of metal and a second layer of a second type of metal dissimilar from the first type of metal;
      preparing an interface between the first layer and the second layer to increase a quantity of dislocation sites there along in correspondence with the target; and
      after the forming, loading the multilayer thin film device with an amount of one or more isotopes of hydrogen to form hydrogen clusters in the dislocation sites.

2. The method of claim 1, wherein the first type of metal is selected from a group consisting of Pd, U, Ti, Li, Au, Ag, Ni, and alloys thereof.

3. The method of claim 1, which includes forming a hydride with the first type of metal.

4. The method of claim 1, wherein the preparing of the interface includes repetitively loading and deloading the device with at least one isotope of hydrogen five or more times.

5. The method of claim 1, wherein the preparing of the interface includes providing a material with a microscale thickness between the first layer and the second layer, the material being in the form of one or more of: particles, fibers, wires, mesh, and a porous layer.

6. The method of claim 1, wherein the preparing of the interface includes forming a number of channels in at least one of the first layer and the second layer.

7. The method of claim 1, which includes at least one of:
   operating the multilayer thin film device to provide at least one of charged particles and x-rays;
   operating the multilayer thin film device in a power system;
   providing superconductivity with the multilayer thin film device; and
   providing the multilayer thin film device as an inertial confinement fusion target.

8. A method, comprising:
   preparing a device including a first layer of a first type of metal and a second layer of a second type of metal dissimilar from the first type of metal to provide an interface therebetween;
   repetitively loading and deloading the device with one or more isotopes of hydrogen at least 10 times during the preparing thereof to increase a quantity of dislocation sites along the interface; and
   supplying at least one isotope of hydrogen to operate the device.

9. The method of claim 8, wherein the first type of metal is selected from a group consisting of Pd, U, Ti, Li, Au, Ag, Ni, and alloys thereof.

10. The method of claim 8, which includes at least one of:
    providing a material with a microscale thickness along an interface between the first layer and the second layer; and
    forming a number of channels in at least one of the first layer and the second layer.

11. The method of claim 8, which includes at least one of: operating the device to provide at least one of charged particles and x-rays and operating the device in a power system.

12. The method of claim 8, which includes providing superconductivity with the device.

13. A method, comprising:
    preparing a multilayer thin film device including a first layer and a second layer of a material dissimilar from the first layer;
    providing a plurality of nanoscale voids between the first layer and the second layer during the preparing of the multilayer thin film device, which includes at least one of: (a) placing a material with a microscale thickness along the interface and (b) forming a plurality of one or more of channels, pores, holes, and voids in one or more of the first layer and the second layer; and
    supplying one or more isotopes of hydrogen to the device to form hydrogen clusters therein.

14. The method of claim 13, wherein the first layer is comprised of a metallic substance selected from a group consisting of Pd, U, Ti, Li, Au, Ag, Ni, and alloys thereof.

15. The method of claim 13, wherein the first layer is comprised of Pd and the second layer is comprised of PdO.

16. The method of claim 13, which includes repetitively loading and deloading the device with at least one isotope of hydrogen five or more times.

17. The method of claim 13, wherein the providing of the nanoscale voids includes the placing of the material along the interface and the material includes one or more of particles, fibers, wires, mesh and a porous layer.

18. The method of claim 17, wherein the nanoscale voids each have a minimum dimension of no more than 50 nanometers.

19. The method of claim 13, wherein the providing of the nanoscale voids includes the forming of one or more of the channels, pores, holes, and voids.

20. The method of claim 13, which includes at least one of: operating the multilayer thin film device to provide at least one of charged particles and x-rays and operating the multilayer thin film device in a power system.

21. The method of claim 13, which includes providing superconductivity with the multilayer thin film device.

* * * * *